(12) United States Patent
Mayer et al.

(10) Patent No.: US 7,538,637 B2
(45) Date of Patent: May 26, 2009

(54) ACOUSTIC WAVE TRANSDUCER WITH TRANSVERSE MODE SUPPRESSION

(75) Inventors: Markus Mayer, Taufkirchen (DE); Ralph Stömmer, Neubiberg (DE); Günter Kovacs, Munich (DE); Andreas Bergmann, Haiming (DE); Pasi Tikka, Taufkirchen (DE)

(73) Assignee: EPCOS AG, Munich (DE)

( * ) Notice: Subject to any disclaimer, the term of this patent is extended or adjusted under 35 U.S.C. 154(b) by 207 days.

(21) Appl. No.: 10/563,890

(22) PCT Filed: Jun. 16, 2004

(86) PCT No.: PCT/EP2004/006499

§ 371 (c)(1),
(2), (4) Date: Aug. 2, 2006

(87) PCT Pub. No.: WO2005/006547

PCT Pub. Date: Jan. 20, 2005

(65) Prior Publication Data

US 2007/0018755 A1  Jan. 25, 2007

(30) Foreign Application Priority Data

Jul. 10, 2003 (DE) ................................ 103 31 323

(51) Int. Cl.
*H03H 9/64* (2006.01)
*H03H 9/25* (2006.01)
(52) U.S. Cl. .................... 333/193; 333/195; 310/313 R
(58) Field of Classification Search ......... 333/193–196; 310/313 R, 313 B, 313 C, 313 D
See application file for complete search history.

(56) References Cited

U.S. PATENT DOCUMENTS

| 4,321,567 A | 3/1982 | Sandy |
| 6,121,860 A | 9/2000 | Tsutsumi et al. |

(Continued)

FOREIGN PATENT DOCUMENTS

DE          196 38 398          12/1999

(Continued)

OTHER PUBLICATIONS

Wilkus S. et al "Transverse Mode Compensation of Surface Acoustic Wave Filters", IEEE Ultrasonics Symposium, BD. 1, 16.10.85. pp. 43-45, XP-008035343.

(Continued)

*Primary Examiner*—Vibol Tan
(74) *Attorney, Agent, or Firm*—Fish & Richardson P.C.

(57) ABSTRACT

An acoustic wave transducer includes an acoustic track having electrode fingers for different electrodes. The electrode fingers engage to form exciting finger pairs. The acoustic track also includes marginal areas and an excitation area. The electrode fingers engage in the excitation area. The marginal areas and the excitation area are located along a transverse direction of the acoustic wave transducer. A longitudinal phase speed of an acoustic wave in the acoustic track is less in a marginal area than in the excitation area, and the acoustic wave is excitable and has a transversal basic mode. The following applies in the transversal basic mode for a wave number ky: (ky)2>0 in a marginal area, and (ky)2<0 in an exterior area outside the acoustic track. ky is smaller in the excitation area than in the marginal areas and in the exterior area.

8 Claims, 9 Drawing Sheets

U.S. PATENT DOCUMENTS

| | | | |
|---|---|---|---|
| 6,534,896 B2 * | 3/2003 | Jian et al. | 310/313 B |
| 6,937,116 B2 * | 8/2005 | Takagi et al. | 333/195 |
| 2001/0040489 A1 * | 11/2001 | Matsuda et al. | 333/193 |
| 2003/0122449 A1 | 7/2003 | Bergmann | |
| 2004/0246077 A1 * | 12/2004 | Misu et al. | 333/195 |
| 2006/0226933 A1 * | 10/2006 | Takahashi | 333/195 |

FOREIGN PATENT DOCUMENTS

| | | |
|---|---|---|
| DE | 199 02 162 | 8/2000 |
| EP | 0 935 341 | 8/1999 |

OTHER PUBLICATIONS

Lakin K. et al "A New Interdigital Electrode Transducer Geometry", IEEE Transactions on Microwave Theory and Techniques, Bd. 22, Nr. 8, Aug. 1, 1974, pp. 763-768, XP-002300881, Aug. '94.

Online! Sep. 16, 2004, Massachusetts Institute of Technology, http://web.mit.edu/6-013_book/www/chapter14/14.7html, p. 2 XP-002300884.

Skeie, H. "Problems in the Realization of Flat Delay, narrow-band Surface Acousitc Wave Filters at UHF and Microwave Frequencies", IEEE International Microwave Symposium, May 14, 1975, pp. 356-358, Piscataway, US, XP-002300882.

Sandy F. "Combining Series Sections Weighting with Withdrawal Wighting in Surface Acoustic Wave Transducers", IEEE Trans on Sonics and Ultrasoncis, Bd. 26, Nr. 4, Jul. 1, 1979, pp. 308-312, XP-002300883.

Hirota et al "Analysis of SAW Grating Waveguides Considering Velocity Dispersion Caused by Reflectivity"; 1999 Ultrasonics Symposium, IEEE, pp. 221-226, month unknown.

William J. Tanski "GHz Saw Resonators"; Ultrasonics Symposium, 1979 IEEE; pp. 815-823.

W. Tanski, Proc. 1979 IEEE Ultrasonic Symposium, pp. 815-823, month unknown.

Translation of International Preliminary Examination Report for Application No. PCT/E2004/006499.

* cited by examiner

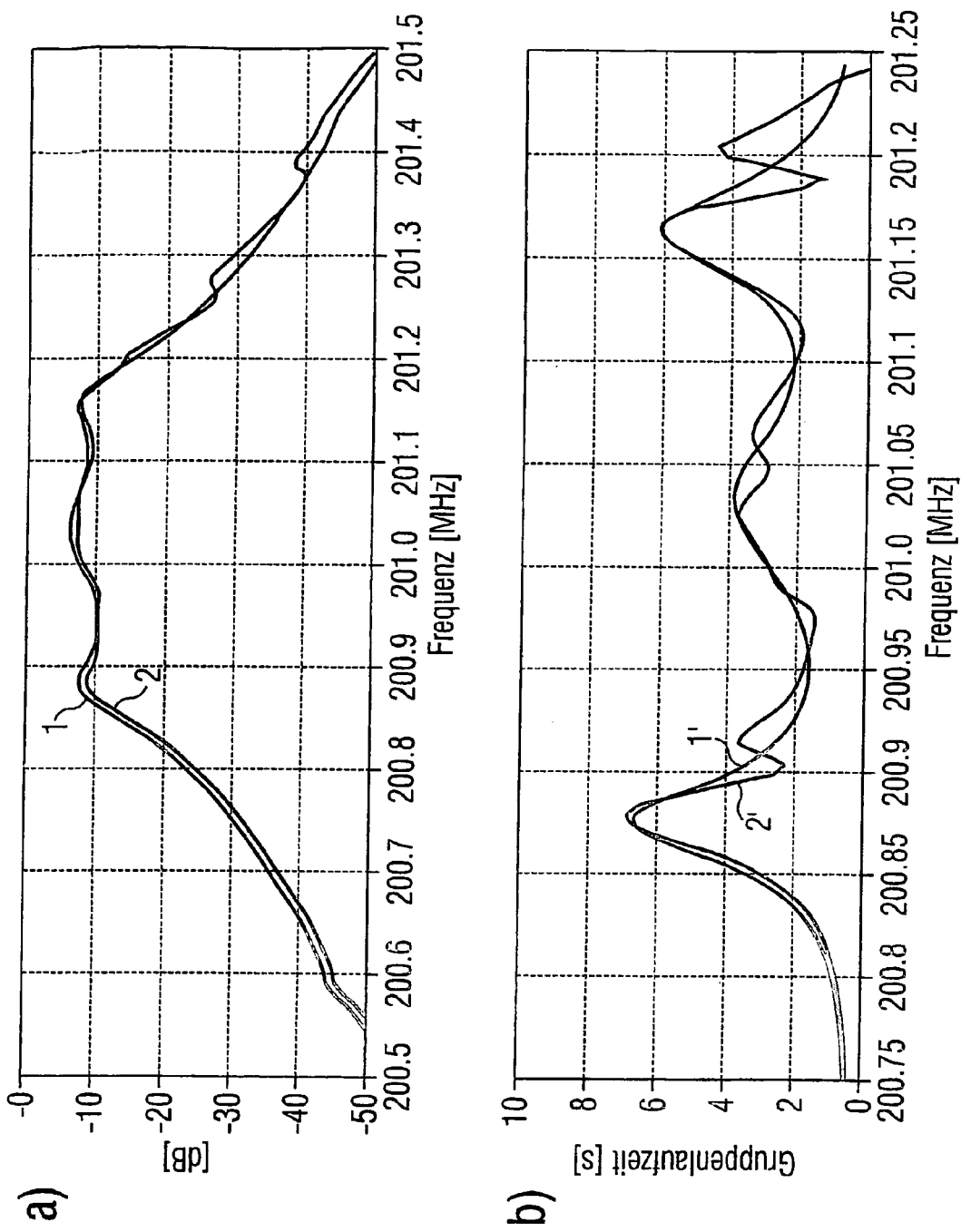

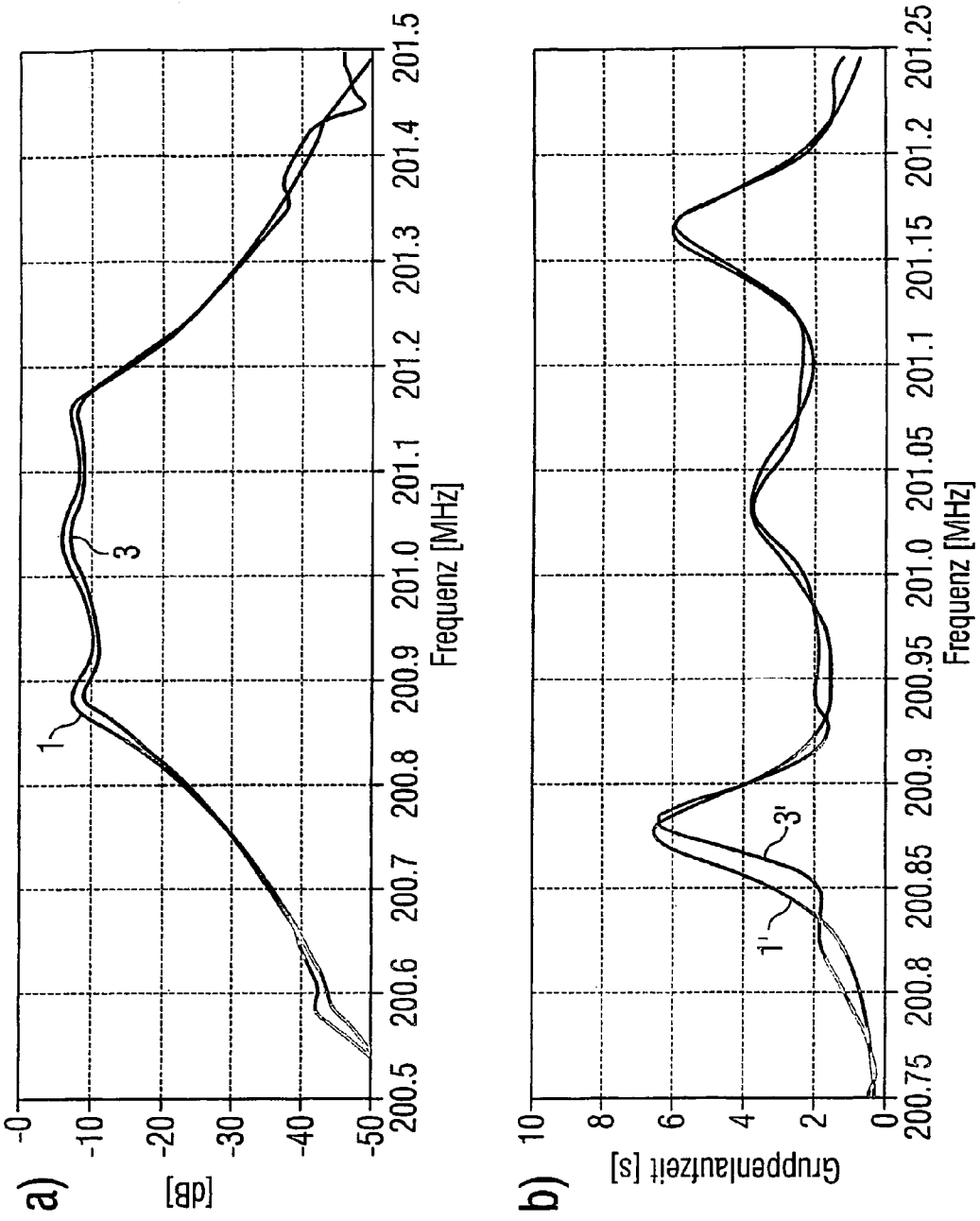

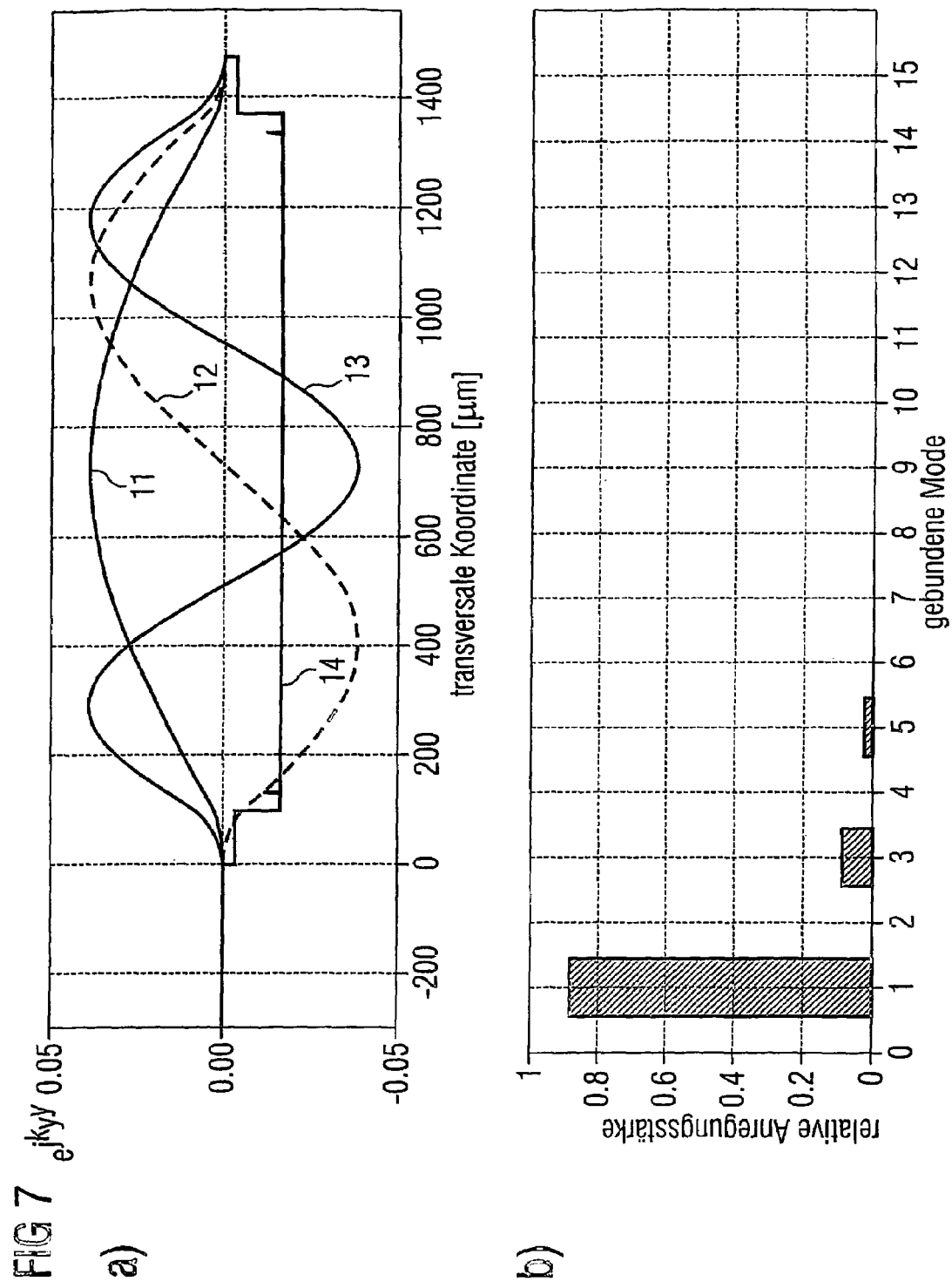

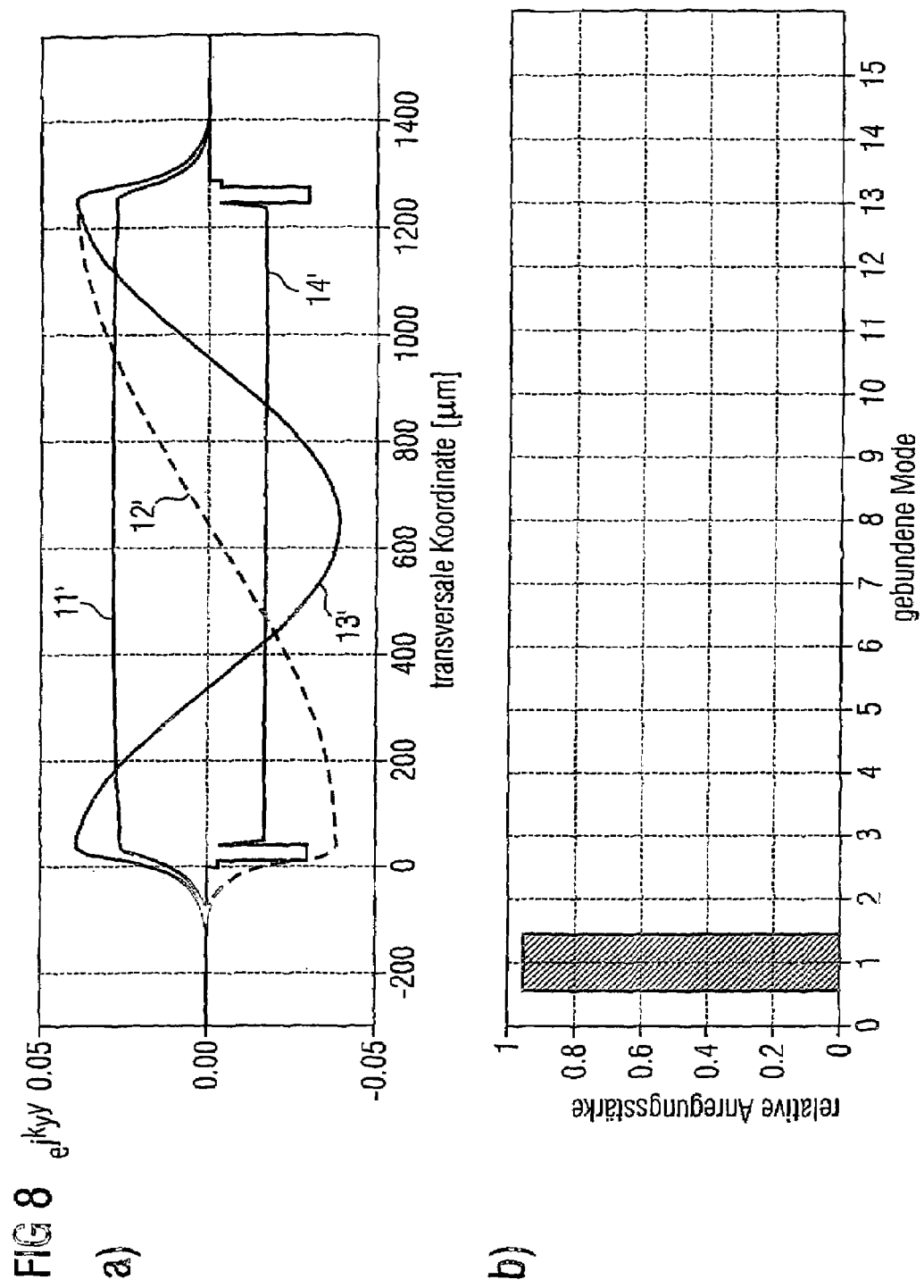

ACOUSTIC WAVE TRANSDUCER WITH TRANSVERSE MODE SUPPRESSION

TECHNICAL FIELD

This application relates to a transducer or component that works with surface acoustic waves (surface acoustic wave component, SAW component) in which interfering transversal wave modes are suppressed. SAW components are used as filters in portable wireless devices.

BACKGROUND

Known SAW components always include a piezoelectric substrate, on the surface of which is provided an acoustic track with component structures arranged therein, e.g., interdigital transducers and reflectors. An electrical signal is converted into an acoustic wave and vice versa in the interdigital transducers.

The acoustic wave propagates in accordance with the mostly periodic arrangement of the electrode fingers of the transducer primarily in both longitudinal directions. Transducers are also known that are used in recursive filters and that preferably radiate an excited acoustic wave only in one longitudinal direction. During propagation of the acoustic wave, diffraction losses occur in a marginal area of the transducer due to radiation of a portion of the surface acoustic wave in the transverse direction.

In most piezoelectric substrates with normal dispersion, e.g., quartz, $LiNbO_3$ and YZ, the velocity of propagation of the excited surface acoustic waves in the acoustic track (SAW track) is reduced, compared to a free substrate surface, by metallization of the substrate surface. Thus, one SAW track or several SAW tracks connected electrically to one another cooperate with adjacent outer areas of the substrate surface in the transversal direction as a waveguide. In the waveguide, transversal wave modes, basic mode, and higher modes, are excitable. The higher modes frequently contribute to unwanted resonances in the stop band or upper pass band area of the SAW component and thus wastefully consume some energy of the wave. These resonances lead to unwanted ripples in the pass band area and furthermore are manifested in increased insertion loss of the component and interfering peaks in the frequency response of the group delay. The filter properties of the component suffer from this.

In previously known methods for suppressing interfering transversal modes, there have been attempts to adapt the transversal excitation profile of an electroacoustic transducer so that feeding of the electrical signal to the greatest extent possible results only in the transversal acoustic basic mode.

For instance, it is possible to vary the transversal length of an overlapping area of two adjacently arranged electrode fingers of an exciting finger pair in the acoustic track in the longitudinal direction so that feeding of the electrical signal is improved in the transversal basic mode. This method is based on overlap weighting and is known, for example, from the publication by W. Tanski, Proc. 1979 IEEE Ultrasonic Symposium, pages 815-823.

Alternatively, while maintaining the distance between opposing busbars of two electrodes of a transducer, it is possible to increase the length of the inactive electrode fingers, which are also called stubs and which oppose the exciting electrode fingers in the transversal direction, and at the same time to correspondingly decrease the length of the overlapping area of an exciting finger pair. The excitation of higher transversal wave modes can only be avoided to a certain degree in this manner.

Another known method for suppressing higher transversal modes and/or for adapting the excitation profile of a transducer to the shape of the transversal basic mode is known, for example, from DE 196 38 398 C2. An acoustic track is divided into several partial tracks, whereby all partial tracks contribute to exciting the acoustic wave. Given N waveguide modes to be suppressed, the acoustic track is divided into N partial tracks, whereby the excitation profile can be adapted to the form of the transversal basic mode by adjusting the track widths and/or the sign of the excitation in each of the partial tracks so that the higher transversal modes are suppressed. A disadvantage of this method is that dividing the track depends on the exact number of waveguide modes to be suppressed and therefore the design of the component is also complex.

SUMMARY

This application describes a transducer that works with surface acoustic waves and that has an acoustic track, and arranged in the acoustic track are component structures, in particular electrode fingers of a first and second electrode that engage one another. The acoustic track and/or the corresponding component structures are arranged on a piezoelectric substrate. In the acoustic track, an acoustic wave is excitable that has a transversal basic mode. The transversal basic mode results from the transversal speed profile of a waveguide that is formed by the acoustic track and the transversal exterior areas adjacent to it. Most of the energy of the acoustic wave is concentrated in the acoustic track. The exterior area is a non-exciting area of the substrate that is adjacent to the acoustic track and in which the amplitude of the acoustic wave is dampened in the transversal direction to a fraction (e.g. to $\frac{1}{10}$) of its maximum value at the edge of the corresponding marginal area. The amplitude of the wave decreases exponentially in the exterior area in the transversal direction that faces away from the track.

In addition, the excursion of the fed surface acoustic wave is called excitation strength. The acoustic track is characterized by the excitation strength (in the longitudinal or transversal direction). The excitation strength is proportional to the difference in potential $\Delta U$ between electrode fingers arranged in the longitudinal direction adjacent to one another and of different electrodes that together form an exciting finger pair. The excitation strength as a function of the transversal coordinate Y is called the excitation profile $\Psi_y$ here.

In the waveguide thus formed, several transversal modes of the acoustic wave (the basic mode and its harmonics) are excitable and/or can be propagated. Maximum feeding of the electrical signal is attained at a certain frequency in the basic mode of the acoustic wave when the acoustic track in the transversal direction is designed so that the corresponding transversal excitation profile Ty of the wave is adapted to the shape $\Phi_y$ of the basic mode, whereby the formula $$\int \Psi_y \Phi_y dy / \sqrt{\int \Psi_y^2 dy \cdot \int \Phi_y^2 dy} \geq \alpha$$

can be the criterion for this adaptation, where, for example, $\alpha = 0.9$ and preferably $\alpha = 0.95$. $\Phi_y$ is the excursion of the transversal basic mode as a function of the transversal coordinate Y.

Given optimum feeding of the electrical signal into the acoustic basic mode, the feeding disappears in higher modes, since the system of transversal modes is nearly orthogonal.

To achieve the foregoing, the acoustic track is divided in the transversal direction into an excitation area and two marginal areas. The longitudinal phase speed of the acoustic wave in the marginal area is less than in the excitation area. The wave number $k_y$ of the transversal basic mode is $(ky)^2>0$ in the marginal area and $(ky)^2<0$ in the exterior area. In the excitation area, $k_y$ is numerically substantially smaller (e.g., by at least one order of magnitude) than in the marginal areas and the exterior areas, where preferably $k_y=0$. The width of the marginal area, measured in the wavelengths, in the transversal direction is preferably essentially $\lambda_y/4$ where $\lambda_y$ is the wavelength of the transversal basic mode in a corresponding marginal area.

Because $k_y$ is numerically substantially larger in the marginal areas than in the other areas, excursion of the transversal mode accordingly varies in the transversal direction in the marginal areas more rapidly. Therefore, an approximately square basic mode can be set in the waveguide, whose edge steepness is a function of the absolute width of the boundary tracks and ultimately of the phase speed of the wave in the marginal areas.

Suppression of interfering transversal wave modes is attained in that the feeding of an electrical signal into the transversal acoustic basic mode is enhanced by introduction and special design of the marginal areas of the acoustic track. One component with suppression of interfering transversal wave modes has the advantage that during the design of such a component, the simulation of the wave propagation in only one direction (the longitudinal direction) is adequate for a good match of the simulated and real transmission functions of the component. No complex simulation of two-dimensional wave propagation effects (in the longitudinal and transversal directions) is necessary.

The division of the acoustic track into an excitation area and two boundary tracks differs from known track division into several partial tracks in that no excitation of the acoustic wave is provided in the marginal areas of a component in the longitudinal direction, but rather the wave excited in the excitation area is intentionally slowed.

The marginal areas are merely for adjusting the transversal waveguide basic mode (deviating from the sine) by prescribing the appropriate speed profile for the waveguide. For adjusting the shape of the transversal basic mode, it is possible to vary the width of the marginal area and/or the phase speed of the wave.

The phase speed of the wave can be reduced in electroacoustic highly coupling piezoelectric substrates with normal dispersion (such as lithium antalate or lithium niobate), reciprocally to the metallization ratio of the surface of the substrate. It is therefore possible to slow the wave in the marginal areas using a metallization ratio that is higher in reference to the excitation area. The marginal areas are each preferably metallized to 100%, where the corresponding marginal area has the shape of a continuous metal strip with a transversal width of $\lambda_y/4$.

In piezoelectric substrates with normal dispersion and a low electroacoustic coupling factor, such as quartz, the phase speed of the wave is reduced using a higher number of electrode fingers per unit of length in the marginal areas. The propagation time of the acoustic wave in a certain direction also depends on the number of edges of the electrode fingers arranged along the wave propagation direction because the wave is "braked" at each edge. Consequently, as an alternative to a continuous metallization of the marginal areas, the wave can be slowed, for example, by using a greater number of electrode fingers per unit of length in the marginal areas compared to the excitation area (energy storage effect). The electrode fingers in the marginal area are preferably arranged on a periodic grid. The metallization ratio in the excitation region and in the marginal areas of the acoustic track can be selected to be the same or different.

In previously known methods, the excitation profile of a transducer is adapted to the transversal basic mode. The idea here of adapting the shape of the transversal basic mode to the prescribed excitation profile of the transducer has the advantage that the interfering transversal wave modes can be suppressed even in the transducers with excitation profiles that are most simple to execute.

In advantageous embodiments, it is also possible to undertake additional fine-tuning of the excitation profile of the transducer to the shape of the transversal basic mode established as described above.

For example, the aforementioned fine-tuning can be achieved by dividing the excitation area in the transversal direction into several partial tracks, where each partial track forms a partial transducer. The partial tracks and/or partial transducers are switched to one another in series and/or in parallel. The difference in potential of the exciting electrode fingers, and thus the excitation strength in the partial tracks, is reduced using serial wiring. The partial tracks are designed identically in the longitudinal direction up to their width, where the width of the partial tracks is selected so that the transversal profile $\Psi_y$ of the excitation strength in the excitation area is adapted to the shape $\Phi_y$ of the transversal basic mode.

Exemplary embodiments are described below in greater detail below using related figures. The figures use depictions that are not to scale to illustrate different exemplary embodiments. Identical or identically acting parts are labeled with the same reference numbers.

DESCRIPTION OF THE DRAWINGS

FIG. 5 illustrates the transmission function of a filter with a conventionally designed acoustic track (simulation with and without taking into account the transversal excitation profile) (a) and the corresponding group delay (b);

FIG. 6 illustrates a) the transmission function of a filter with an acoustic track (simulation with and without taking into account the transversal excitation profile) in a transversal excitation profile adapted to the basic mode; and b) the corresponding group delay;

FIG. 7 illustrates a) the excursion of the transversal wave modes that can be propagated in the acoustic track in a non-adapted transversal excitation profile; and b) the excitation strength corresponding to the modes;

FIG. 8 illustrates (a) the excursion of the transversal wave modes that can be propagated in the acoustic track in a transversal excitation profile that has been adapted to the basic mode; and (b) the excitation strength corresponding to the modes.

DETAILED DESCRIPTION

Figure 1:
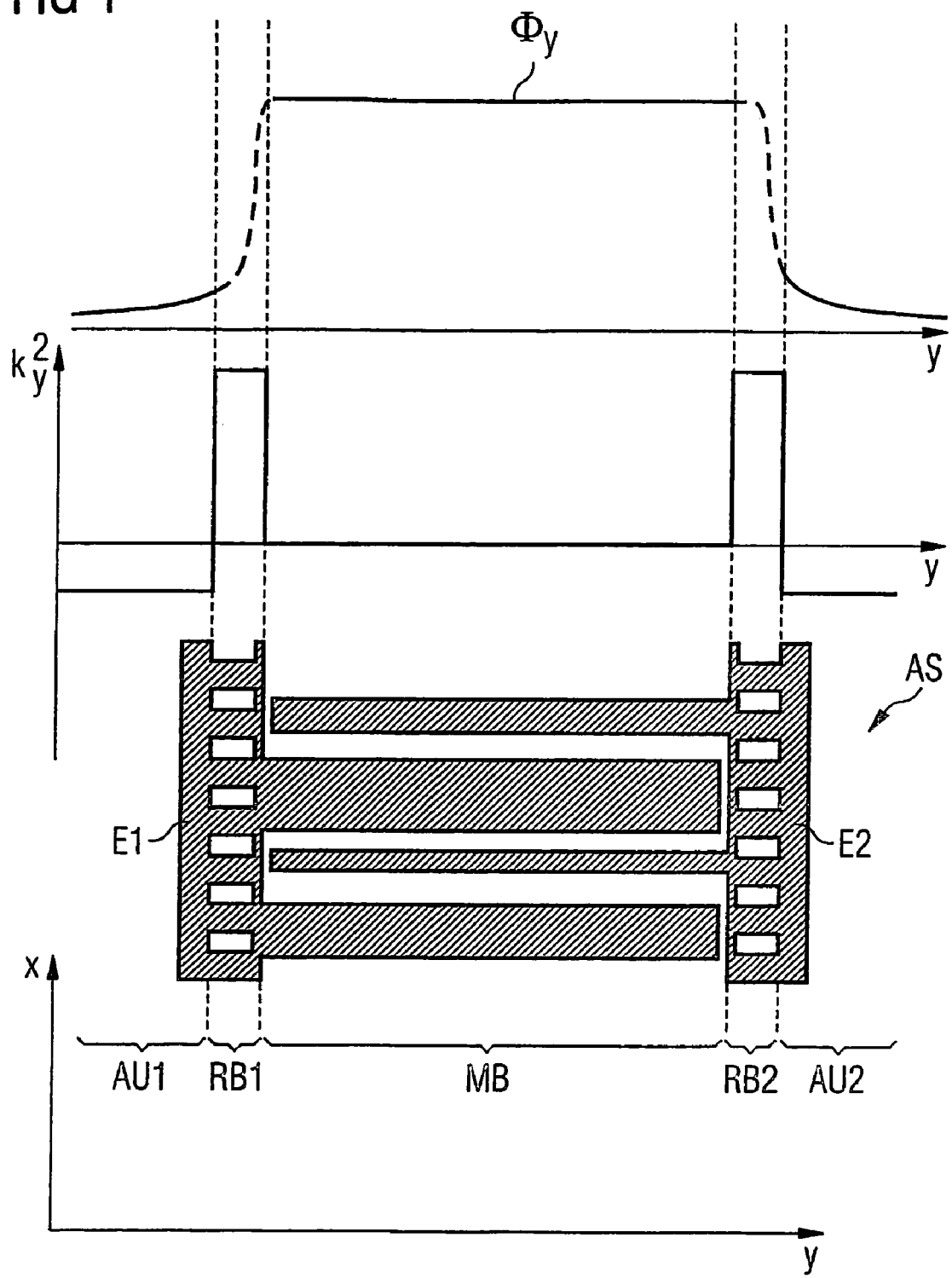
FIG. 1 illustrates a component (bottom), the change in the wave number in the transversal direction (center), and the shape of the corresponding basic mode (top)

FIG. 1 illustrates a component with an acoustic track AS that is arranged on a piezoelectric substrate, such as quartz, in which a surface acoustic wave can be propagated in the longitudinal direction X (bottom). The square of the wave number $k_y$ of the transversal mode as a function of the transversal coordinate Y (center) and the transversal basic mode $\Phi_y$ results from the $k_y$ profile (top).

The acoustic track AS is divided into an excitation area MB and two marginal areas RB1 and RB2. The width of the marginal area in the transversal direction is approximately $\lambda_y/4$ where $\lambda_y$ is the wavelength of the transversal basic mode in the marginal area.

The component has two electrodes E1 and E2, each of which includes a busbar and electrode fingers attached to it. The electrode fingers of different electrodes are alternately arranged in the excitation area and form exciting finger pairs. The electrode fingers in one marginal area all belong to the same electrode and are therefore inactive, i.e., the acoustic wave is not excited in this marginal area. The marginal areas in this exemplary embodiment have a lattice structure, in which the periodicity of the lattice is smaller compared to the mean grid of the excitation area MB. Excess edges of the electrode finger lattice in the margin area and opposite the excitation area contribute to reducing the phase speed of the acoustic wave induced in the marginal area.

The excitation profile of the acoustic track AS is defined by the excitation area and is rectangular in this embodiment.

The acoustic track AS and the exterior areas AU1, AU2 adjacent to the acoustic track in the transversal direction together form a waveguide. The transversal waveguide modes are characterized by a phase factor $e^{jk_y y}$. For bound wave modes, the transversal wave number $k_y$ is real within the core area of the waveguide (i.e. excitation area MB) and imaginary in the jacket area of the waveguide (exterior areas AU1, AU2).

In the excitation area MB, $k_y$ is substantially smaller than $k_y$ in other areas. When $k_y=0$ (in the excitation area), the basic mode has a plateau in this area, i.e., the excursion of the wave in the excitation area is constant in the transversal direction Y.

In the exterior areas AU1, AU2 that are outside of the acoustic track AS and that are adjacent to it in the transversal direction, $k_y$ is imaginary or $(k_y)^2<0$. Therefore, the amplitude of the wave in the exterior areas AU1, AU2 drops exponentially in the transversal direction.

The transversal wave number $k_y$ is real or $(k_y)^2>0$ in the marginal areas RB1, RB2. A transition occurs from the maximum amplitude in the excitation area to a fraction of the amplitude at the edge of the exterior area.

Using the width of the marginal area selected as described above, the shape of the transversal basic mode is established so that the amplitude of the wave drops outward exponentially to the exterior areas and at which in the marginal areas in the transversal direction a standing wave forms. The convexity of the standing wave is at the edge of the excitation area and of the marginal area or of the nodes of the standing wave at the edge of the exterior area. This is how the shape of the basic mode is maximally adapted to the shape of the rectangular excitation profile of the acoustic track AS.

The value of the wavelength $\lambda_y$ in the marginal area is a function of the velocity of propagation of the wave in the longitudinal direction, which depends on the grid of the electrode finger lattice in the marginal area. The absolute width of the marginal area can be selected to be different (depending on the prescribed value $\lambda_y$). The width of the marginal area measured in wavelengths is always $\lambda_y/4$. The steepness of the corresponding edge of the basic mode can be adjusted using the change in the absolute width of the marginal area.

The greater the wave number $k_y$ in the marginal area, the smaller the corresponding wavelength and consequently the absolute width of the marginal area. At large $k_y$ values, the steepness of the edges of the transversal basic mode increases accordingly.

Figure 1A:
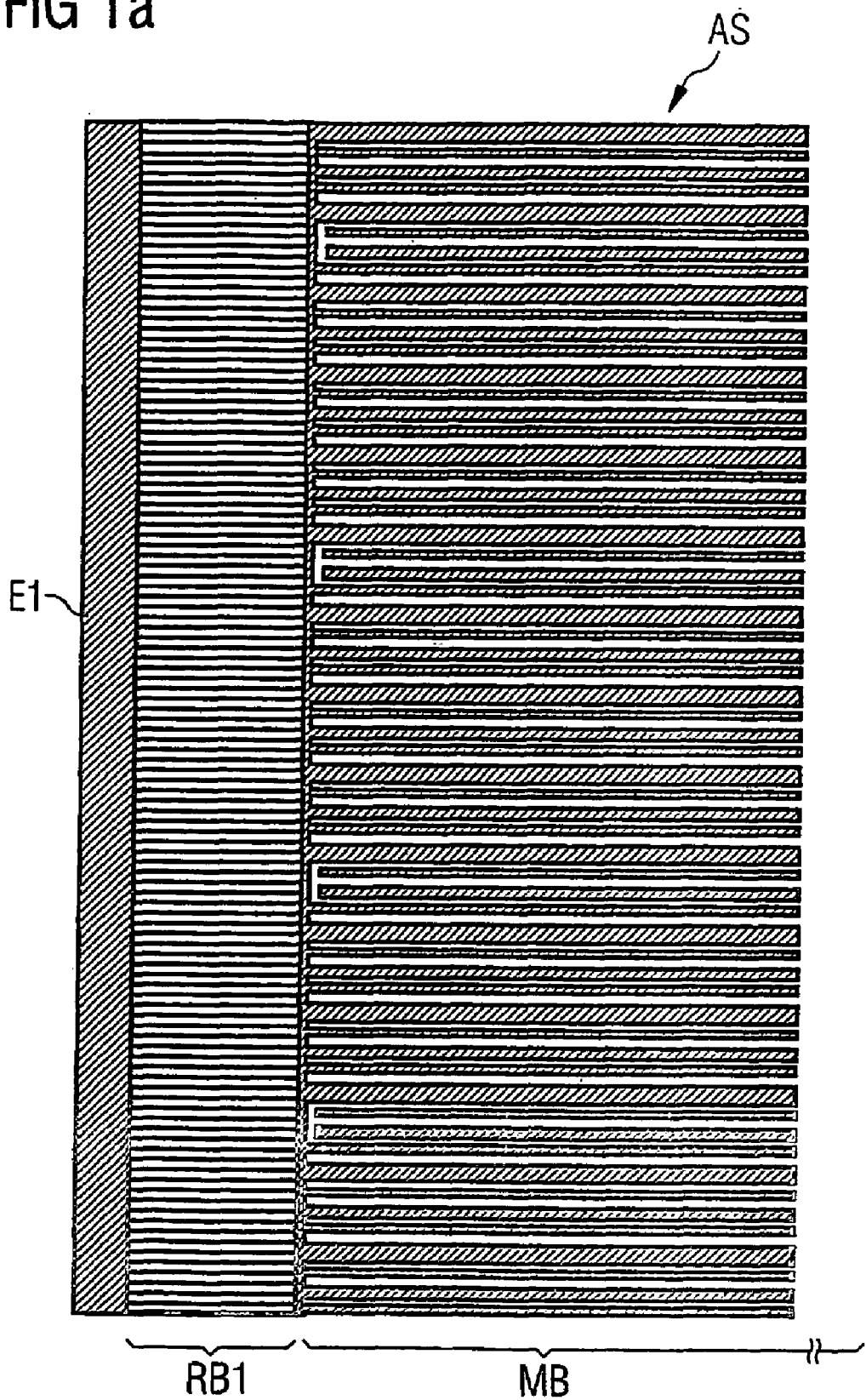
FIG. 1a illustrates the structure of the component by segment.

FIG. 1a is an illustration by segment of a component that is designed as a recursive transducer.

However, it is also possible to at least partially design the excitation area of the component in the longitudinal direction as in a normal finger transducer, known as such, with interdigital fingers arranged on the periodic grid, or as in a split finger transducer, known as such.

In another embodiment, in particular with piezoelectric substrates with a high electroacoustic coupling (such as lithium niobate or lithium antalate), in which the short-circuit on the fully metallized surface leads to a significant reduction in the phase speed, the marginal areas can alternatively be designed as continuously metallized areas with a transversal width of $\lambda_y/4$.

In practice, it has not been possible to attain a perfectly rectangular transversal basic mode by introducing the marginal areas because the absolute width of the marginal areas cannot be selected to be as small as desired. Therefore, in further embodiments, the transversal excitation profile of the transducer is fine-tuned to the transversal basic mode, e.g., by dividing the excitation area into several partial tracks. Such fine-tuning is only possible in a very narrow frequency range because the shape of the basic mode depends on frequency.

Figure 2:
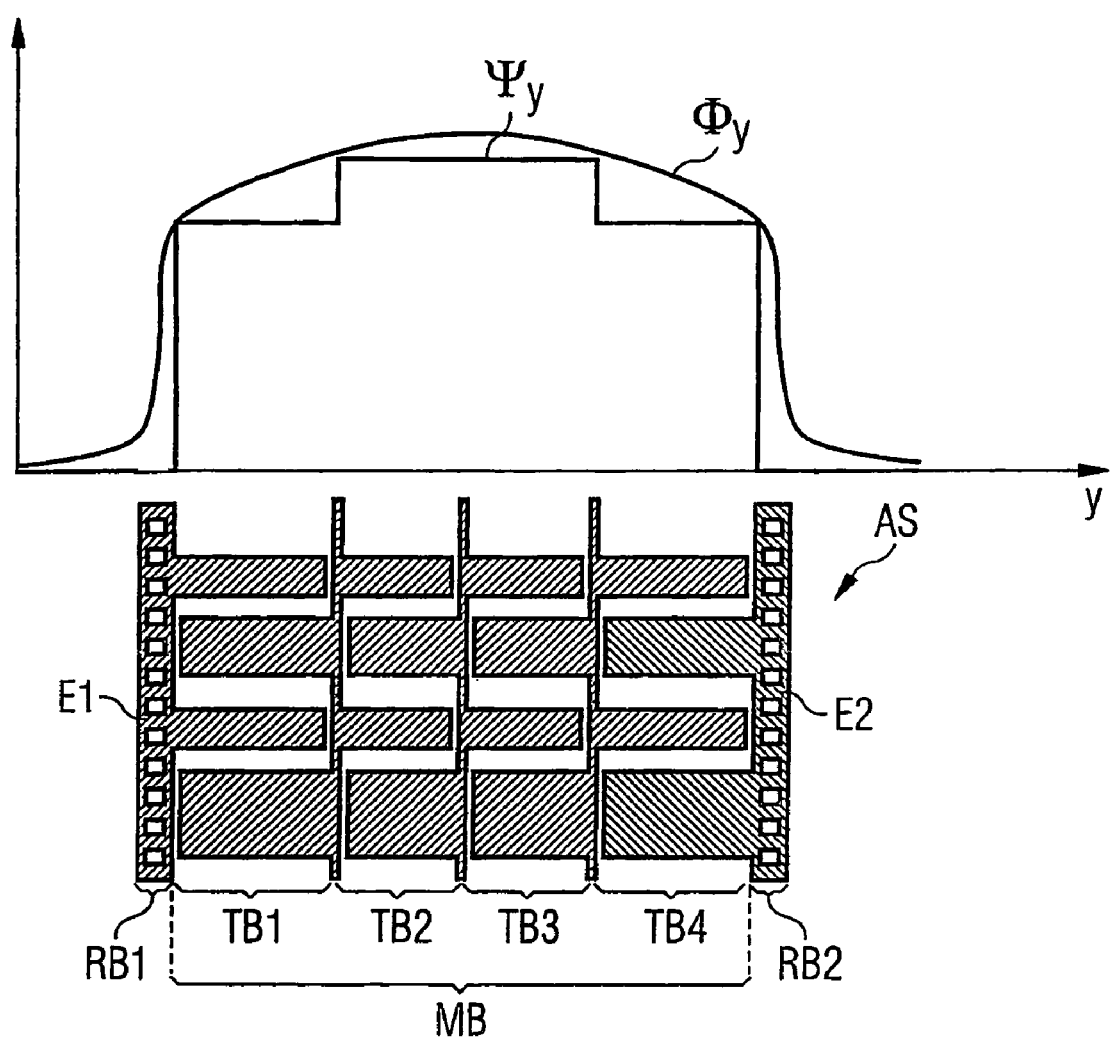
FIG. 2 illustrates another component, the excitation area of which is divided into partial tracks that are wired serially to one another (bottom), the corresponding transversal excitation profile, and the shape of the transversal basic mode (top)

FIG. 2 illustrates a further development in which the excitation area MB of the acoustic track AS is divided in the transversal direction into four partial tracks TB1, TB2, TB3 and T4. The partial tracks are switched electrically in series.

Figure 3:
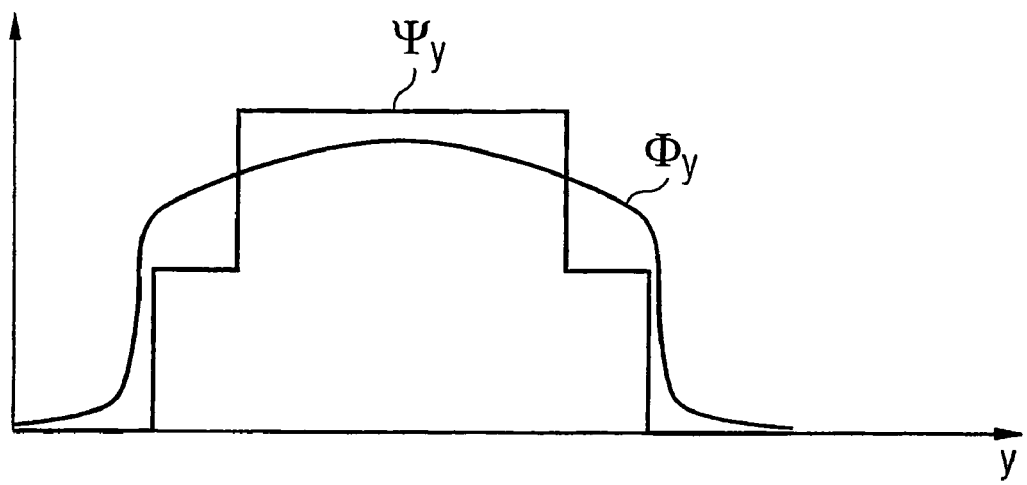
FIG. 3 illustrates another component, the excitation area of which is divided into partial tracks that are wired to one another serially and in parallel (bottom), the corresponding transversal excitation profile, and the shape of the transversal basic mode (top)
Figure 3:
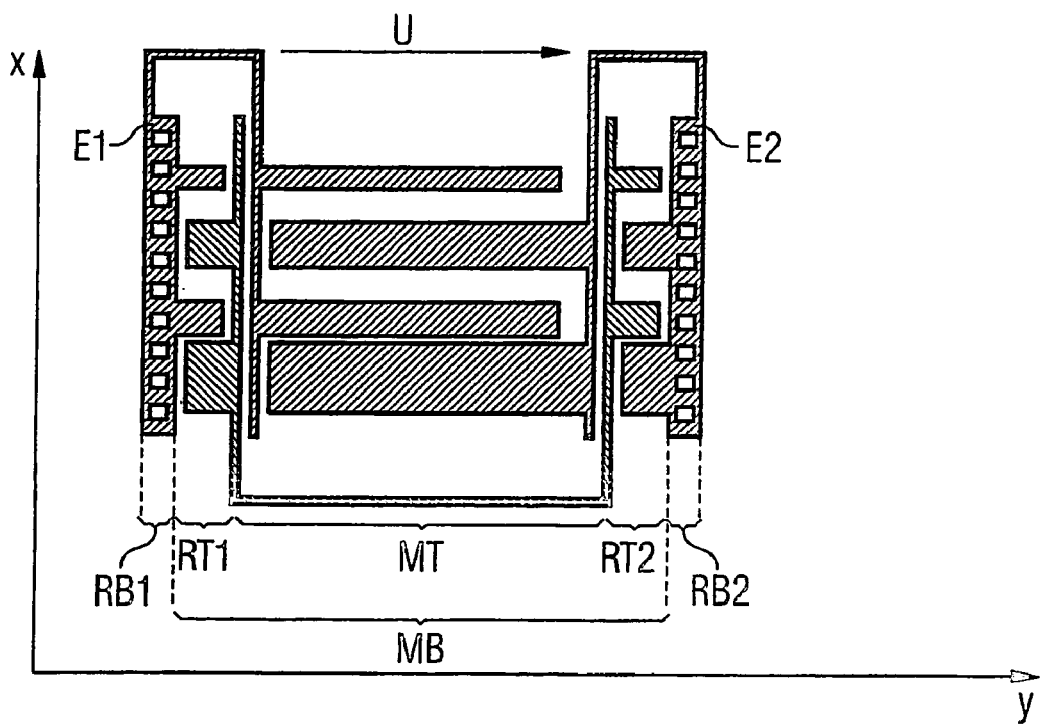

Illustrated at the bottom of FIGS. 2 and 3 is a part of the acoustic track AS, and the corresponding excitation profile $\Psi_y$ of the excitation area as well as the shape of the transversal basic mode $\Phi_y$ are illustrated schematically at the top.

All partial tracks of this type of divided excitation area are identically designed in the longitudinal direction. The widths of the partial tracks are preferably selected to be different. The partial track with the number i has a width $b_i$.

The difference in voltage between the electrodes E1 and E2 is U. The excitation strength of an electrode finger pair in a partial track is proportional to the difference in voltage $U_i$ between the electrode fingers. Conversely, $U_i$ depends proportionally on the capacity of the partial track, which is directly proportional to the width $b_i$ of the partial track. The following applies:

$$U_1 = \frac{b_i^{-1}}{\sum_k b_k^{-1}} U.$$

It is therefore possible to intentionally adjust or weight the excitation strength in one partial track i by changing its width. Given serial wiring of the partial tracks, the impedance of the acoustic track AS with a divided excitation area is correspondingly larger than the impedance of an acoustic track with a non-divided excitation area.

In order to maintain the impedance of the acoustic track divided into partial tracks, it is possible to wire a few of the partial tracks to one another serially and to wire this serial circuit to another partial track or to several partial tracks in parallel (see, for example, the exemplary embodiment illustrated in FIG. 3).

The excitation area MB is divided into the following partial tracks: a center partial track MT and two marginal partial tracks RT1, RT2. The marginal partial tracks RT1, RT2 are switched in series with one another, where the serial circuit of the partial tracks RT1 and RT2 is switched parallel to the center partial track MT. The width of the center partial track MT is substantially greater than the width of the marginal partial track RT1, RT2—preferably by at least a factor of 5. The impedance of the acoustic track AS is largely determined by the impedance of the partial track MT, which is wider. The reduction in the excitation strength in the marginal partial tracks RT1 and RT2 compared to the center partial track MT, to which the voltage U is applied, is attained by dividing the applied voltage U between the serially wired marginal partial tracks RT1 and RT2.

Figure 4:
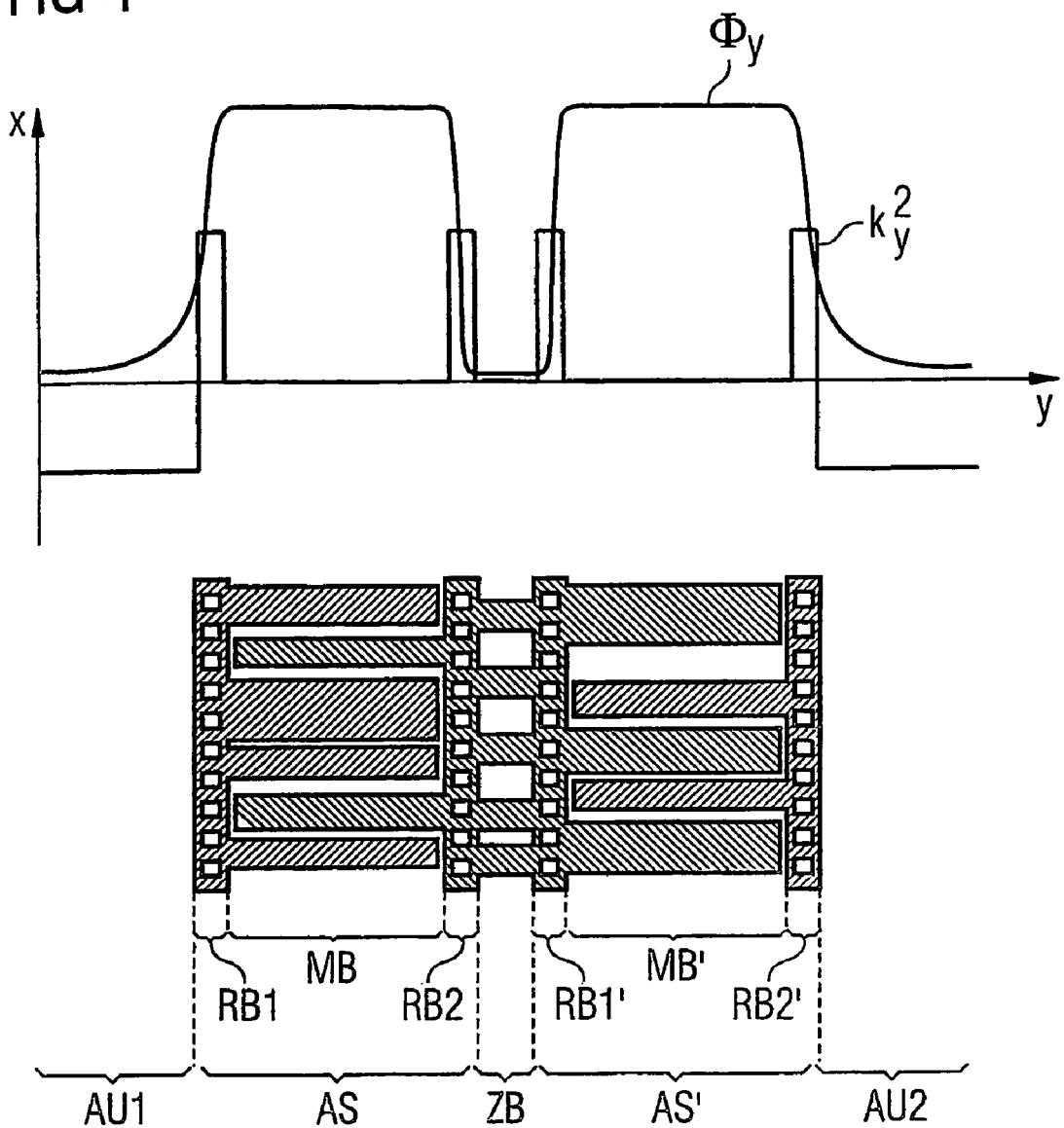
FIG. 4 illustrates another component with several acoustic tracks that are wired one after the other (bottom), the corresponding transversal basic mode, and the change in the wave number in the transversal direction (top)

FIG. 4 illustrates another embodiment. FIG. 4 illustrates by segment a component (bottom), the corresponding transversal basic mode, and the square of the transversal wave number as a function of the transversal coordinate (top).

In this embodiment, an additional acoustic track AS' is provided that is divided—similar to the acoustic track AS—into an excitation area MB' and marginal areas RB1' and RB2'; it is essentially identical to the acoustic track AS. In this exemplary embodiment, the acoustic tracks AS and AS' are electrically switched in series with one another, where they are arranged in the transversal direction parallel to one another. An intermediate area ZB is located between the acoustic tracks AS and AS'. The widths of the marginal areas RB1, RB2 and RB1', RB2' of the acoustic tracks AS and AS' are selected so that $k_y$ in the intermediate area ZB is substantially smaller (e.g., by at least one order of magnitude) than in the marginal areas RB1, RB2 and in the exterior areas AU1, AU2. The phase speed in the excitation areas MB, MB' of different acoustic tracks AS, AS' and in the intermediate area ZB is essentially the same, because otherwise the plateaus of the transversal basic mode could not be attained in both excitation areas.

Furthermore, it is possible to wire the acoustic tracks that are arranged parallel in parallel with one another. It is also possible to combine one serial and one parallel wiring of the tracks when there are more than two acoustic tracks arranged in parallel.

In each additional acoustic track of a component designed with several tracks, the marginal areas are designed to be $(k_y)^2>0$, where although the acoustic wave is not excited, the wave excited in the corresponding excitation area can be propagated in the longitudinal direction. One intermediate area with a small $k_y$ is provided between each two acoustic tracks. There is no excitation of the acoustic wave in the intermediate areas. Each intermediate area is preferably designed as a lattice, where the number of electrode fingers per unit of length is preferably the same in all excitation areas and in all intermediate areas, and the metallization ratio of the surface area is preferably the same in these areas. The electrode fingers in the intermediate area ZB are preferably arranged on a periodic grid. Thus the electrode fingers can also be periodically arranged in the excitation areas or can form unidirectionally radiating cells.

The shape of the transversal basic mode with an approximately constant excursion in the areas that correspond to the excitation areas, and the disappearing excursion in the intermediate areas, can be adjusted by appropriately selecting the absolute widths of the marginal areas, where the width of a marginal area, measured in wavelengths, is always a quarter wavelength. In this manner, the shape of the transversal basic mode is adapted to the excitation profile of a multi-track arrangement.

FIG. 5 illustrates a) the simulated transmission function of a filter with an acoustic track with a rectangular transversal excitation profile that does not have any marginal areas (i.e., the transversal excitation profile is not adapted to the shape of the transversal basic mode), and b) the corresponding frequency of the group delay.

The curves 1 and 1' correspond to a 1D simulation of the transmission function (1) or the group delay (1'), i.e. to a simulation without taking into account the wave propagation in the transversal direction. The curves 2 and 2' correspond to a 2D simulation of the transmission function (2) or the group delay (2"), i.e., to a simulation taking into account the wave propagation in the transversal direction. The 2D simulation corresponds to a real behavior of the filter.

Both the real transmission function 2 and the real group delay 2' in the pass band area have a deviation of 1D behavior (curves 1 and 1') that manifests itself as an unwanted ripple of the pass band area. Additional secondary maximums in the amplitude are located on the right edge of the transmission function 2.

The cause of the secondary maximums are higher transversal wave modes, the phase factors of which are illustrated as a function of the transversal coordinate—curves 11, 12 and 13—in FIG. 7 at the top and their relative intensities in FIG. 7 at the bottom.

The transversal mode with the ordinal number 1 is the transversal basic mode that is sinusoidal given a conventionally designed acoustic track (with an excitation area without marginal areas) (see curve 11 in FIG. 7). The relative intensity of the first transversal mode is approx. 90%. Furthermore, additional transversal wave modes with odd ordinal numbers are excited in an acoustic track designed in this manner. A standing acoustic wave that corresponds to the second transversal wave mode (curve 12) cannot be excited due to symmetry conditions.

In this instance, the relative intensity of the third transversal wave mode (of the second harmonic of the basic mode, see curve 13 in FIG. 7) is approx. 9%, and the relative intensity of the fifth wave mode, not shown in FIG. 7, is approx. 1%.

Feeding the electrical signal into the third and fifth transversal modes occurs because the transversal excitation profile of the acoustic track is rectangular, whereas the shape of the transversal mode is sinusoidal. These modes lead to unwanted resonances above the pass band area of the filter that cause the filter quality (and also the insertion loss in the pass band area) to worsen.

The higher transversal wave modes are not excited in the excitation profile and the shape of the transversal basic mode that are adapted to one another.

FIG. 6 illustrates the simulation of the transmission function of a filter with an acoustic track in accordance with FIG. 1a (a) with and without taking into account the transversal excitation profile and the corresponding group delay as a function of frequency (b). The curves 3 and 3' relate to a 2D simulation of the filter.

The shape of the basic mode in an acoustic track of this type is approximately rectangular and is therefore adapted to the excitation profile.

The phase factors of the transversal waveguide modes, which are excitable and/or can be propagated in the acoustic track designed in accordance with FIG. 1a, are illustrated at the top of FIG. 8, and the relative intensities of the modes are illustrated at the bottom of FIG. 8. The phase factor of the first, second and third transversal modes corresponds to the curves 11', 12' and 13'. The relative intensity of the higher transversal modes is very slight compared to the intensity of the transversal basic mode.

The curves 14 and 14' and FIGS. 7 and 8 depict the speed profile of one of the waveguides corresponding to the acoustic track, where the velocity of propagation of the wave is intended in the longitudinal direction. FIG. 8 illustrates that the velocity of propagation of the wave in the marginal areas of the acoustic track is smaller than in other areas of the waveguide.

In principle, the improvements described herein can be used in all SAW components known as such, e.g., double mode SAW filters, normal finger transducers and recursive filters, and is not limited to the number of elements illustrated in the figures or to specific frequency ranges.

The invention claimed is:

1. An acoustic wave transducer comprising:
an acoustic track comprising electrode fingers for different electrodes, the electrode fingers engaging to form exciting finger pairs, the acoustic track comprising marginal areas and an excitation area, the electrode fingers engaging in the excitation area, the marginal areas and the excitation area being located along a transverse direction of the acoustic wave transducer;
wherein a longitudinal phase speed of an acoustic wave in the acoustic track is less in a marginal area than in the excitation area;
wherein the acoustic wave is excitable and has a transversal basic mode;
wherein the following applies in the transversal basic mode for a wave number $k_y$:
$(k_y)^2 > 0$ in a marginal area, and
$(k_y)^2 < 0$ in an exterior area outside the acoustic track; and
wherein $k_y$ is smaller in the excitation area than in the marginal areas and in the exterior area;
wherein the excitation area comprises partial tracks in the transverse direction, the partial tracks corresponding to partial transducers that are interconnected in series and/or in parallel;
wherein the partial tracks are substantially identical in a longitudinal direction, and at least two of the partial tracks have different widths; and
wherein the partial tracks have widths that adapt a transversal profile $\Psi_y$ of an excitation strength in the excitation area to a shape $\Phi_y$ of the transversal basic mode.

2. The acoustic wave transducer of claim 1, in which the following applies for adapting the transversal profile $\Psi_y$ of the excitation strength to the shape $\Phi_y$ of the transversal basic mode, where "y" corresponds to the transverse direction:

$$\int \Psi_y \Phi_y dy / \sqrt{\int \Psi_y^2 dy \cdot \int \Phi_y^2 dy} \geq 0.9.$$

3. An acoustic wave transducer comprising:
an acoustic track comprising electrode fingers for different electrodes, the electrode fingers engaging to form exciting finger pairs, the acoustic track comprising marginal areas and an excitation area, the electrode fingers engaging in the excitation area, the marginal areas and the excitation area being located along a transverse direction of the acoustic wave transducer;
wherein a longitudinal phase speed of an acoustic wave in the acoustic track is less in a marginal area than in the excitation area;
wherein the acoustic wave is excitable and has a transversal basic mode;
wherein the following applies in the transversal basic mode for a wave number $k_y$:
$(k_y)^2 > 0$ in a marginal area, and
$(k_y)^2 < 0$ in an exterior area outside the acoustic track; and
wherein $k_y$ is smaller in the excitation area than in the marginal areas and in the exterior area;
wherein the excitation area comprises partial tracks in the transverse direction, the partial tracks corresponding to partial transducers that are interconnected in series and/or in parallel;
wherein the partial tracks comprise a center partial track and marginal partial tracks;
wherein the marginal partial tracks are interconnected in series and form a series circuit;
wherein the series circuit is connected in parallel to the center partial track; and
wherein a width of the center partial track is greater than a width of a marginal partial track by at least a factor of five.

4. The acoustic wave transducer of claim 1, wherein the marginal areas each comprise a continuous metal strip in a longitudinal direction and have a transverse width of $\lambda_y/4$, where $\lambda_y$ is a wavelength of the transversal basic mode in a corresponding marginal area.

5. The acoustic wave transducer of claim 1, wherein a number of electrode fingers per unit of length is greater in the marginal areas than in the excitation area.

6. The acoustic wave transducer of claim 1, wherein the electrode fingers for different electrodes define a periodic grid in the excitation area.

7. The acoustic wave transducer of claim 3, wherein the marginal areas each comprise a continuous metal strip in a longitudinal direction and have a transverse width of $\lambda_y/4$, where $\lambda_y$ is a wavelength of the transversal basic mode in a corresponding marginal area.

8. The acoustic wave transducer of claim 3, wherein a number of electrode fingers per unit of length is greater in the marginal areas than in the excitation area.

* * * * *